United States Patent
Yoshida

(10) Patent No.: US 10,431,456 B2
(45) Date of Patent: Oct. 1, 2019

(54) IMPRINT APPARATUS AND METHOD

(71) Applicant: Samsung Display Co. Ltd., Yongin-si, Gyeonggi-do (KR)

(72) Inventor: Futoshi Yoshida, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/869,189

(22) Filed: Jan. 12, 2018

(65) Prior Publication Data
US 2019/0035620 A1    Jan. 31, 2019

(30) Foreign Application Priority Data
Jul. 31, 2017    (KR) .................. 10-2017-0097298

(51) Int. Cl.
| | | |
|---|---|---|
| H01L 21/027 | (2006.01) | |
| B41K 3/42 | (2006.01) | |
| G02F 1/1335 | (2006.01) | |
| G02F 1/1362 | (2006.01) | |

(52) U.S. Cl.
CPC .............. *H01L 21/027* (2013.01); *B41K 3/42* (2013.01); *G02F 1/133528* (2013.01); *G02F 2001/133548* (2013.01); *G02F 2001/136295* (2013.01)

(58) Field of Classification Search
CPC .................. H01L 21/027; H01L 31/18; H01L 2224/29082
See application file for complete search history.

(56) References Cited

U.S. PATENT DOCUMENTS

| | | | | |
|---|---|---|---|---|
| 9,563,119 | B2* | 2/2017 | Lan | ..................... H01L 33/0095 |
| 2009/0215208 | A1* | 8/2009 | Coe-Sullivan | ......... B82Y 20/00 |
| | | | | 438/22 |
| 2011/0276306 | A1* | 11/2011 | Hamada | ................ G02F 1/1303 |
| | | | | 702/150 |
| 2012/0183690 | A1* | 7/2012 | Titulaer | ................. B82Y 10/00 |
| | | | | 427/256 |
| 2012/0215338 | A1* | 8/2012 | Inoue | ................... H01L 51/0096 |
| | | | | 700/108 |

(Continued)

FOREIGN PATENT DOCUMENTS

| | | |
|---|---|---|
| JP | 2014213552 A | 11/2014 |
| KR | 1020100108282 A | 10/2010 |

(Continued)

*Primary Examiner* — Zandra V Smith
*Assistant Examiner* — John M Parker
(74) *Attorney, Agent, or Firm* — Cantor Colburn LLP

(57) ABSTRACT

An imprint method includes: applying a applying a material for forming a patterned layer having a pattern, to a substrate; feeding a stamp film including a stamp pattern corresponding to the pattern of the patterned layer, along a pressure roller and an idle roller; forming the patterned layer having the pattern, including: the pressure roller pressing the stamp film toward the material to contact the stamp pattern of the stamp film with the material layer, curing the material layer in contact with the stamp pattern, and moving the pressure roller and the idle roller to peel the stamp film off the cured material layer by a peeling force, to form the patterned layer having the pattern; and detecting a defect in the formed patterned layer, during the peeling of the stamp film, by sensing the peeling force in real time by a pressure sensor connected to the pressure roller.

12 Claims, 8 Drawing Sheets

(56) References Cited

U.S. PATENT DOCUMENTS

| | | | | |
|---|---|---|---|---|
| 2014/0252679 A1* | 9/2014 | Hwang | ................. | B29C 59/046 |
| | | | | 264/293 |
| 2014/0327188 A1* | 11/2014 | Naganuma | ............ | G03F 7/0002 |
| | | | | 264/446 |
| 2018/0017862 A1* | 1/2018 | Ter Meulen | .......... | G03F 7/0002 |
| 2018/0031966 A1* | 2/2018 | Ter Meulen | .............. | B41F 7/02 |
| 2018/0101093 A1* | 4/2018 | Chen | ..................... | G03F 7/0002 |
| 2018/0126381 A1* | 5/2018 | Huff | ................. | B01L 3/502715 |

FOREIGN PATENT DOCUMENTS

| | | |
|---|---|---|
| KR | 2011114309 A | 6/2011 |
| KR | 101062128 B2 | 9/2011 |

\* cited by examiner

IMPRINT APPARATUS AND METHOD

This application claims priority to Korean Patent Application No. 10-2017-0097298, filed on Jul. 31, 2017, and all the benefits accruing therefrom under 35 U.S.C. § 119, the content of which in its entirety is herein incorporated by reference.

BACKGROUND

1. Field

The invention relates to an imprint apparatus and method.

2. Description of the Related Art

With the development of technology, display products that are relatively smaller, lighter and have better performance are being produced. Of these display products, liquid crystal displays ("LCD"s) are widely used.

An LCD changes the arrangement of liquid crystal molecules in a liquid crystal layer by applying a voltage to the liquid crystal layer. The changed arrangement of the liquid crystal molecules converts a change in optical characteristics such as birefringence, optical rotation, dichroism and light scattering of liquid crystal cells into a visual change. As a result, an image is displayed by the LCD using the light having the changed optical characteristics.

The LCD includes a polarizing plate, a display panel, an optical sheet, and a backlight assembly. Recently, an in-cell polarizer structure in which the polarizing plate is disposed inside the display panel has been used. For example, a wire grid polarizer may be used as the in-cell polarizer structure.

SUMMARY

One or more exemplary embodiment of the invention provide an imprint apparatus and method which can detect a defect in fine patterns formed on a substrate, such as for use as a polarizer structure.

However, features of the invention are not restricted to the one set forth herein. The above and other features of the invention will become more apparent to one of ordinary skill in the art to which the invention pertains by referencing the detailed description of the invention given below.

According to an exemplary embodiment of the invention, there is provided an imprint method including: applying material layer for forming a patterned layer having a pattern, to a substrate; feeding a stamp film including a stamp pattern corresponding to the pattern of the patterned layer, along a pressure roller and an idle roller, to dispose the stamp pattern of the fed stamp film facing the material layer on the substrate; forming the patterned layer having the pattern, including: the pressure roller pressing the fed stamp film toward the material layer on the substrate to contact the stamp pattern of the fed stamp film with the material layer and form the pattern in the material layer, curing the material layer in contact with the stamp pattern of the pressed stamp film, and moving the pressure roller and the idle roller to peel the stamp film including the stamp pattern off the cured material layer by a peeling force, to form the patterned layer having the pattern from the cured material layer; and detecting a defect in the pattern of the formed patterned layer, during the peeling of the stamp film off the cured material layer, by sensing the peeling force in real time by a pressure sensor connected to the pressure roller.

The pressure sensor may be a load cell.

The stamp film including the stamp pattern corresponding to the pattern of the patterned layer may be fed from a stamp feeding unit including a tension roller which maintains tension of the fed stamp film constant, and the pressure sensor connected to the pressure roller may sense the peeling force in real time in a state where the tension of the stamp film is maintained constant by the tension roller of the stamp feeding unit.

The pressure roller may press the fed stamp film toward the material layer on the substrate by applying a pressing force to the fed stamp film, and the pressure sensor connected to the pressure roller may sense the pressing force applied to the fed stamp film when the fed stamp film is pressed.

The detecting the defect in the pattern of the formed patterned layer may further include a control processor determining whether the defect has occurred by detecting in real time, a change in the peeling force sensed in real time by the pressure sensor connected to the pressure roller.

The detecting the defect in the pattern of the formed patterned layer may further include the control processor identifying a position in the cured material layer at which the change in the peeling force is detected as a position in the pattern of the formed patterned layer at which the defect has occurred.

The detecting the defect in the pattern of the formed patterned layer may further include the control processor determining that the defect has occurred in the pattern of the formed patterned layer when the change in the peeling force is greater than a preset peeling force change.

The moving the pressure roller and the idle roller may peel the stamp film off the cured material layer at a peeling speed, and the method may further include when the control processor determines the defect occurs in the pattern of the patterned layer, the control processor adjusting the peeling speed to be lower than a preset peeling speed.

The method may further include the control processor detecting a period of time at which the peeling force is outside a preset peeling force, and when the control processor detects the period of time at which the peeling force is outside the preset peeling force is outside a preset time range, the control processor may determine that operation of the pressure roller is abnormal.

The moving the pressure roller and the idle roller to peel the stamp film off the cured material layer by the peeling force may include moving the pressure roller away from the substrate having the cured material thereon and in a direction parallel to the substrate.

The curing the material layer may include exposing the material layer in contact with the stamp film including the stamp pattern to a light source or a heat source.

The applying the material layer for forming the patterned layer having the pattern, may include a material applicator providing a resin material to the substrate.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
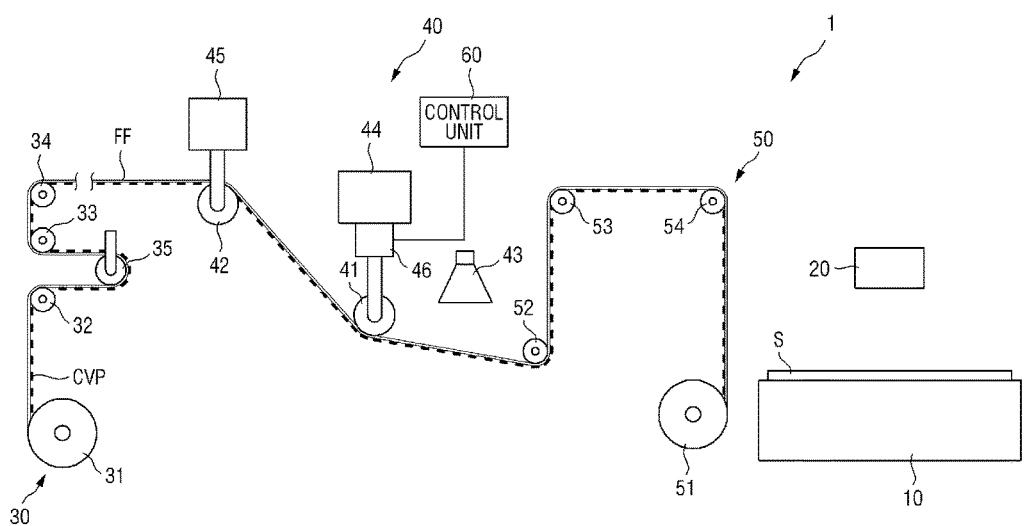
FIG. 1 is a side view of an exemplary embodiment of an imprint apparatus according to the invention.

Advantages and features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this disclosure will be thorough and complete and will fully convey the invention to those skilled in the art, and the invention will only be defined by the appended claims.

It will also be understood that when a layer is referred to as being related to another element such as being "on" another layer or substrate, it can be directly on the other layer or substrate, or intervening layers may also be present. In contrast, when a layer is referred to as being related to another element such as being "directly on" another layer or substrate, no intervening layers are present. The same reference numbers indicate the same components throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, embodiments will be described with reference to the attached drawings.

A wire grid polarizer, such as one used in a display panel of a display device, can be fabricated by imprint lithography which forms nano-patterns and is drawing attention as a nano-patterning technique that can replace photolithography.

In a conventional imprinting process, photocurable resin is applied onto a substrate, and then ultraviolet light is irradiated to the applied photocurable resin to cure the photocurable resin, while a stamp having protruding and recessed patterns corresponding to fine patterns to be formed is pressed on and into the photocurable resin. Then, the stamp is separated from the pressed photocurable resin to form the fine patterns on the substrate. The fine patterns formed on the substrate can be used as an etching mask for forming fine patterns such as non-patterns of an actual device.

In such an imprinting process, however, the stamp may be separated from the pressed photocurable resin in a state where the photocurable resin on the substrate is wholly or partially uncured, a pressing force with which the stamp is pressed on or into the photocurable resin may not be uniform, or a peeling force with which the stamp is peeled off from the cured photocurable resin may not be uniform due to a defect in the protruding and recessed patterns of the stamp. These may cause a defect in the fine patterns formed by such imprinting process.

The defect in the fine patterns described above is generally detected by a camera such as during a manufacturing process and/or an inspection process of a product formed thereby. However, since the fine patterns are nano-sized, the defect in the nano-sized fine patterns is not well detected by the camera. Therefore, if patterns are formed for a display device using the fine patterns having the defect, the display device may have a defect. Therefore, an improved process for forming and/or inspecting fine patterns or nano-patterns used in a display device is desired.

Figure 2:
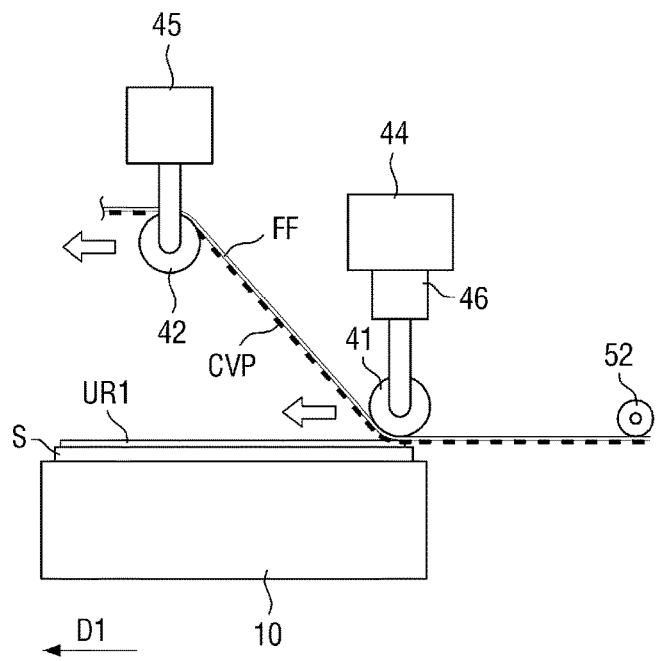
FIGS. 2 and 3 illustrate an exemplary embodiment of a pressing process using an imprint unit of an imprint apparatus according to the invention.
Figure 3:
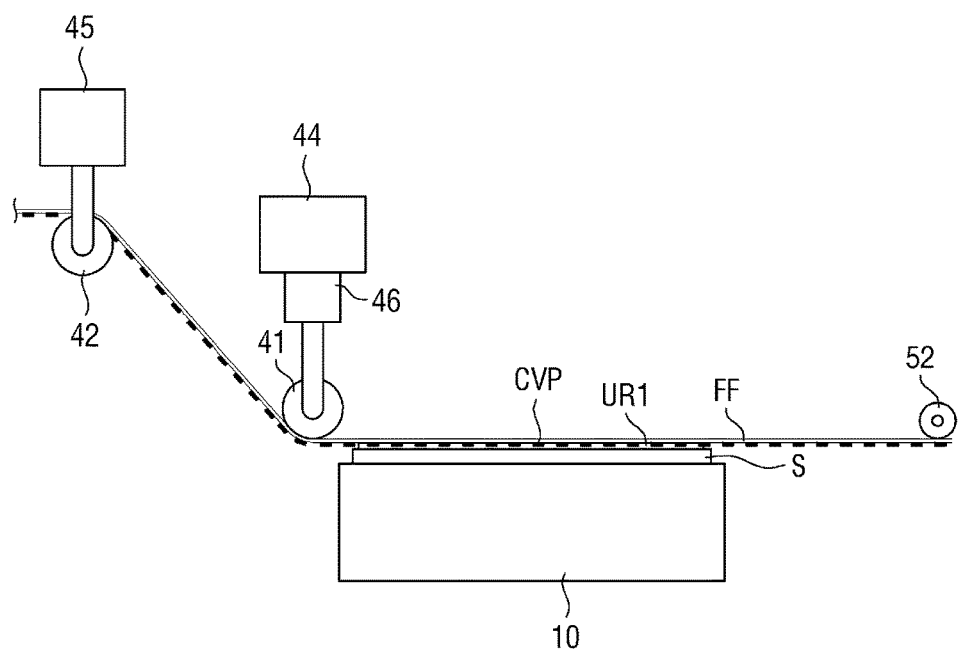
Figure 4:
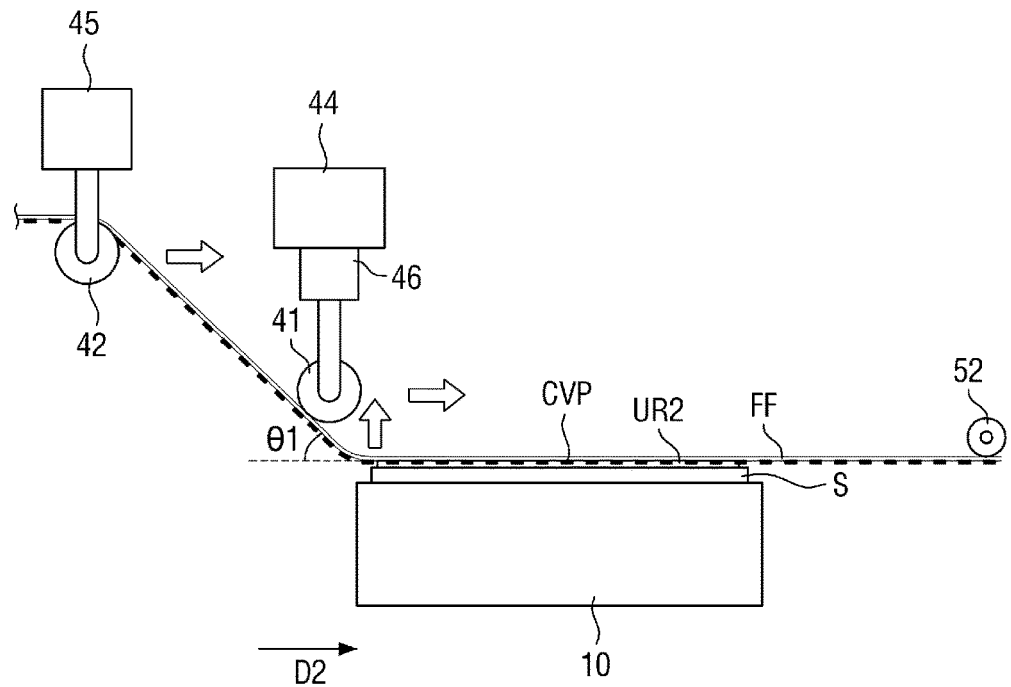
FIGS. 4 and 5 illustrate an exemplary embodiment of a peeling process using the imprint unit of the imprint apparatus according to the invention.
Figure 5:
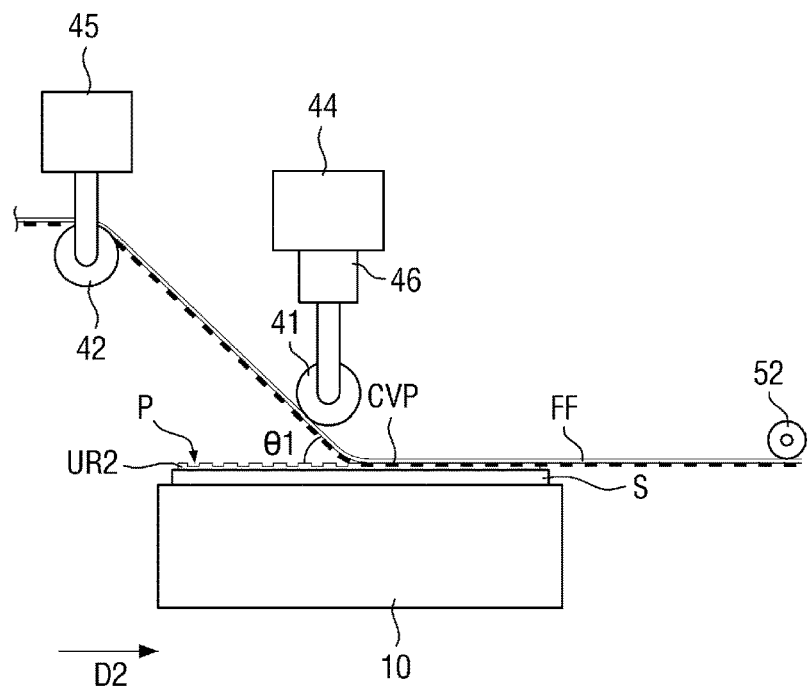
Figure 6:
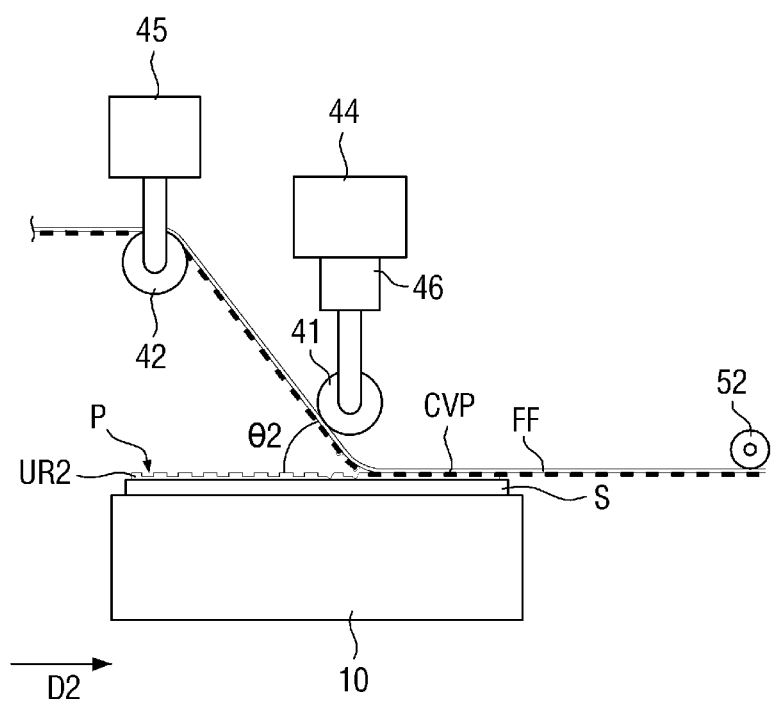
FIG. 6 illustrates an exemplary embodiment of a change in peeling force in the peeling process of FIG. 5.

FIG. 1 illustrates an exemplary embodiment of an imprint apparatus 1 according to the invention. FIGS. 2 and 3 illustrate an exemplary embodiment of a pressing process using an imprint unit 40 of the imprint apparatus 1, and FIGS. 4 and 5 illustrate an exemplary embodiment of a peeling process using the imprint unit 40. FIG. 6 illustrates an exemplary embodiment of a change in peeling force in the peeling process of FIG. 5.

Referring to FIG. 1, the imprint apparatus 1 according to the embodiment includes a stage 10, an application unit 20, a stamp feeding unit 30, the imprint unit 40, a stamp collection unit 50 and a control unit 60.

The stage 10 is configured to support a substrate S in an imprinting process for forming patterns on the substrate S using a stamp film FF including a stamp pattern CVP provided in plurality thereon. The stage 10 may be configured to be movable in a space between the application unit 20 and the imprint unit 40, relative to the various units of the imprint apparatus described above.

The application unit 20 may be disposed at a first side of the imprint apparatus 1 and applies a material for forming a fine pattern or nano-pattern, such as a resin, to the substrate S. The application unit 20 may be, for example, an inkjet printing unit that ejects a photocurable resin (material) solution. In this case, an inkjet head of the inkjet printing unit may eject the photocurable resin solution onto the substrate S while making a reciprocating motion relative to the substrate S and/or the stage 10. Although the application unit 20 is illustrated as an inkjet printing unit, it is not limited to the inkjet printing unit.

The stamp feeding unit 30 may be disposed on a second side of the imprint apparatus 1 opposite to the first side thereof, and may be configured to feed the stamp film FF to the imprint unit 40. In an exemplary embodiment, for example, the stamp feeding unit 30 may include a winding roller 31 on which the stamp film FF can be wound and from which the stamp film FF can be fed into other units of the imprint apparatus 1, guide rollers 32 through 34 which support and move the stamp film FF unwound from the winding roller 31 to the imprint unit 40, and a tension roller 35 which is disposed between the guide rollers 32 through 34 to maintain a constant tension of the stamp film FF when the stamp film FF is moved.

The stamp feeding unit 30 configured as described above may feed the stamp film FF unwound from the winding roller 31 to the imprint unit 40 using the guide rollers 32 through 34 with a constant tension in the stamp film FF maintained by the tension roller 35.

The imprint unit 40 is configured to bring the stamp film FF fed from the stamp feeding unit 30 into contact with the substrate S coated with the resin by pressing the stamp film FF into the coated resin, to form patterns by peeling the stamp film FF off from the substrate S having the pressed resin thereon after curing the resin, and to detect a defect in the formed patterns by sensing the peeling force of the stamp film FF peeled off from the pressed resin on the stamp film FF. In an exemplary embodiment, for example, the imprint unit 40 may include a pressure roller 41, an idle roller 42, a light source 43 and a pressure sensor 46.

The stamp film FF is fed along the pressure roller 41 and the idle roller 42 of the imprint unit 40. The pressure roller 41 and the idle roller 42 are configured to press and peel the stamp an FF. The light source 43 is configured to irradiate ultraviolet light so as to cure the resin applied to the substrate S. The pressure sensor 46 is configured to sense the peeling force of the stamp film FF. When the resin is provided as a thermosetting resin, a heat source (not shown) for supplying heat to cure the thermosetting resin may be provided instead of the light source 43. A case where the resin is provided as a photocurable resin will be described as an example, and the operation of the above components will be described in detail below. Open shape arrows are used in the figures to indicate movement of various elements as described below.

Referring to FIG. 2, the pressure roller 41 presses the stamp film FF in a direction toward the stage 10 on which the substrate S is supported, so that the stamp film FF comes into contact with a surface of a photocurable resin UR1 applied to the substrate S by the application unit 20. In an exemplary embodiment, for example, the pressure roller 41 may descend to bring the stamp film FF into contact with a first side of the photocurable resin UR1 (e.g., at a right side of the substrate S). Here, the stage 10 may have been moved from the application unit 20 to the imprint unit 40.

The pressure roller 41 moves horizontally in a first direction D1 (see FIG. 2) together with the idle roller 42 to apply a force to the stamp film FF so that the stamp film FF is pressed into contact with the photocurable resin UR1 along the first direction D1, from the first side to a second side of the photocurable resin UR1 opposite the first side (e.g., at a left side of the substrate S) as illustrated in FIG. 3.

In FIGS. 2 and 3, the photocurable resin UR1 is in an uncured and deformable state. Although not illustrated in the drawing, the light source 43 (see FIG. 1) is placed above the stamp film FF in contact with the photocurable resin UR1. Therefore, the photocurable resin UR1 on the substrate S is cured by ultraviolet light emitted from the light source 43 (see FIG. 1). In an exemplary embodiment, referring to FIGS. 2 and 3 for example, a portion of the stamp film FF in contact with the photocurable resin UR1 is exposed behind the pressure roller 41 as the pressure roller 41 moves in the first direction D1. Light from the light source 43 may be applied at this exposed portion of the stamp film FF in contact with the photocurable resin UR1 to cure the pressed photocurable resin UR1.

Referring to FIGS. 4 through 6, the pressure roller 41 moves upward a predetermined distance from the stage 10 and then moves horizontally in a second direction D2 opposite to the first direction D1 together with the idle roller 42. Accordingly, with the stamp film FF under tension, the stamp film FF is peeled off from the pressed photocurable resin UR1 to form a patterned photocurable resin UR2 having a pattern P defined in plurality at an upper surface of the patterned photocurable resin UR2. Here, the patterned photocurable resin UR2 is formed from the photocurable resin UR1 which has been patterned and cured.

For the above operation, a first driving unit 44 may include an actuator and a pneumatic cylinder and may be connected to the pressure roller 41, and a second driving unit 45 may include an actuator and a pneumatic cylinder and may be connected to the idle roller 42.

The tension of the fed stamp film FF extended along the various rollers of the imprint apparatus 1 is kept constant by the tension roller 35 and the peeling force determined to peel off the stamp film FF may define a peeling angle of the stamp film FF relative to the photocurable resin UR2. In an exemplary embodiment, for example, the peel angle may be $\theta 1$ when the peeling force of the stamp film FF is normal. The peeling angle may be an angle formed by a surface of the photocurable resin UR2 on which the stamp film FF is pressed and a surface of the stamp film FF which faces the photocurable resin UR2.

When the peeling angle is maintained at $\theta 1$, it denotes that a normal peeling force is maintained. At this time, no defect may occur in the patterns P formed on the photocurable resin UR2.

When the peeling force of the stamp film FF changes to be different from the normal peeling force, it may denote that a defect occurs in the patterns P formed on the photocurable resin UR2. In an exemplary embodiment, for example, when the actual or measured peeling force of the stamp film FF from the photocurable resin UR2 becomes greater than the normal peeling force, the peeling angle may be changed from $\theta 1$ to $\theta 2$ as illustrated in FIG. 6. The peeling angle $\theta 2$ denotes that the normal peeling force is not maintained. In this case, a portion of the photocurable resin UR2 may be detached from a remaining portion of the photocurable resin UR2 on the substrate S and be attached to the stamp film FF being peeled off from the photocurable resin UR2. That is, a pattern defect in which the patterns P formed in or on the photocurable resin UR2 are undesirably deformed or broken may occur.

A defect in the patterns P formed in or on the photocurable resin UR2 is caused by a change in the peeling force of the stamp film FF as described above. The change in the peeling force of the stamp film FF may be detected by the pressure sensor 46 connected to the pressure roller 41.

The pressure sensor 46 may be disposed on and connected to a support of the pressure roller 41. The pressure sensor 46 may be composed of a load cell. A force (e.g., the peeling force of the stamp film FF) may be measured and detected in real time by the pressure sensor 46 in a state where the tension of the stamp film FF is kept constant simultaneously with the peeling off of the stamp film FF from the photocurable resin UR2.

Accordingly, the control unit 60 (see FIG. 1) connected to the pressure sensor 46 can detect a change in the peeling force of the stamp film FF in real time, by referring to the actual or measured peeling force of the stamp film FF detected in real time by the pressure sensor 46. With input of the change in peeling force, the control unit 60 (see FIG. 1) may identify a position relative to the stage 10, the substrate S, the photocurable resin UR2 and/or the stamp film FF where the peeling force of the stamp film FF has changed. In an exemplary embodiment the control unit 60 may identify a position along the photocurable resin UR2 having the patterns P, as a position where a defect has occurred in the patterns P, as indicated by an input of a position where the peeling force of the stamp film FF is changed.

While a case where the pressure sensor 46 senses the peeling force of the stamp film FF has been described above, the pressing force of the stamp film FF relative to the photocurable resin layer can also be sensed using the pressure roller 41. Thus, the pressing force applied to the stamp film FF can be kept constant.

Referring back to FIG. 1, the stamp collection unit 50 may be disposed on a side of the imprint unit 40 and may be configured to collect the stamp film FF used in the imprint unit 40. In an exemplary embodiment, for example, the stamp collection unit 50 may include a rewinding roller 51 on which the used stamp film FF can be wound and guide rollers 52 through 54 which support the stamp film FF used in the imprint unit 40 and move the stamp film FF to the rewinding roller 51.

The control unit 60 may detect a change in the peeling force of the stamp film FF by referring to the peeling force of the stamp film FF detected in real time by the pressure sensor 46, as described above. That is, the control unit 60 may detect the change in the peeling force in real time. In an exemplary embodiment, for example, when a change in the peeling force of the stamp film FF is greater than a preset amount of peeling force change, the control unit 60 may determine that a defect has occurred in the patterns P of the photocurable resin UR2. A defect may not be determined by a change in the peeling force of the stamp film FF which is smaller than the preset amount of peeling force change since such smaller change does not greatly affect the occurrence of a defect in the patterns P of the photocurable resin UR2.

In addition, when a defect occurs in the patterns P of the photocurable resin UR2, the control unit 60 may control the peeling speed of the stamp film FF to be lower than a predetermined peeling speed. This is a portion of the photocurable resin UR2 is attached to the stamp film FF being peeled off generally when the peeling force of the stamp film FF is large. The case where a portion of the photocurable resin UR2 is attached to the stamp film FF being peeled off is an example in a case where a defect occurs in the patterns P of the photocurable resin UR2. Therefore, the peeling force of the stamp film FF may be reduced by reducing the peeling speed of the stamp film FF.

In addition, when a period of time during which the peeling force of the stamp film FF measured by the pressure sensor 46 is outside a preset peeling force range is outside a preset time range, the control unit 60 may determine that the operation of the pressure roller 41 is abnormal. The control unit 60 may detect and make determinations in real time, similar to that described for the pressure sensor 46 sensing the peeling force in real time.

The control unit 60 may be implemented as a computer, processor or similar hardware device using a software component or a combination of software components.

Although not illustrated in the drawings, the overall operation of the components of the imprint apparatus 1 may be controlled by a process control unit. The process control unit may also be implemented as a computer, processor or similar hardware device using a software component or a combination of software components.

As described above, one or more embodiment of the imprint apparatus 1 according to the invention can detect the peeling force of the stamp film FF relative to a pressed material layer in real time by using the pressure sensor 46 installed on the support of the pressure roller 41 which applies the stamp film FF to the material layer.

Accordingly, a change in the peeling force of the stamp film FF from the pressed material layer can be detected, and a defect in the patterns P formed on the substrate S can be detected by referring to the change in the peel force.

In addition, since the defect in the patterns P formed on the substrate S can be detected during the imprinting process, follow-up processing can be performed relatively quickly.

An imprint method using the imprint apparatus 1 according to an embodiment will hereinafter be described.

FIGS. 7 through 13 illustrate an exemplary embodiment of an imprint method using an imprint apparatus according to the invention.

Figure 7:
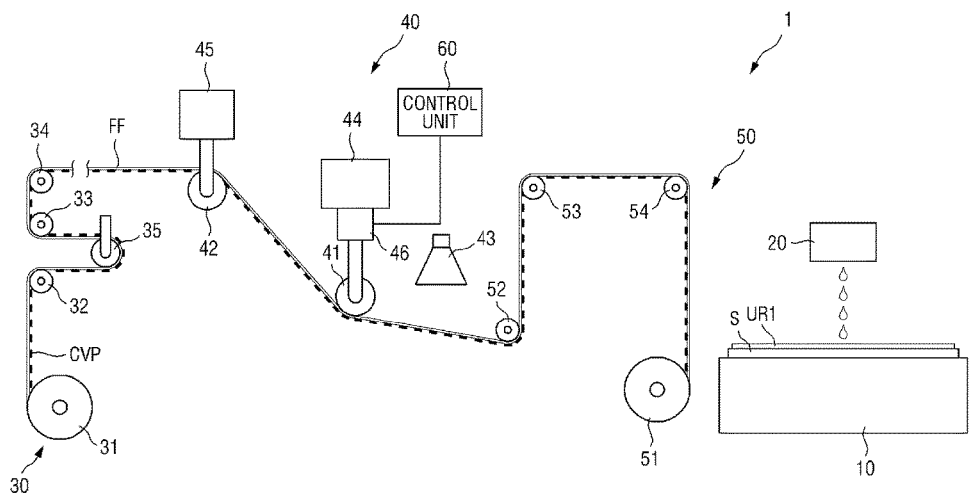
FIGS. 7 through 13 illustrate an exemplary embodiment of an imprint method using an imprint apparatus according to the invention.

Referring to FIG. 7, a material for forming a patterned layer, such as a photocurable resin UR1, is applied to a substrate S supported on a stage 10, by using an application unit 20 (e.g., a material applicator). Since the stage 10 and the application unit 20 have been described above in detail, they will not be described here.

Figure 8:
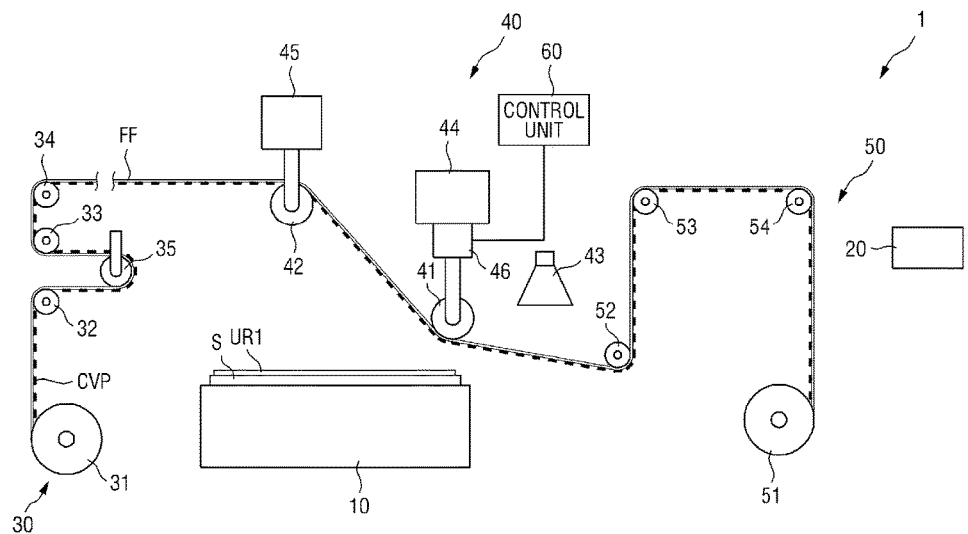

Referring to FIG. 8, the stage 10 having the substrate 10 and the photocurable resin layer UR1 thereon is moved to a position where an imprint unit 40 is disposed, so that the photocurable resin UR1 faces a stamp film FF. An exposed surface of the material layer at which a pattern is formed, is disposed to face a stamp pattern CVP of the stamp film FF.

Figure 9:
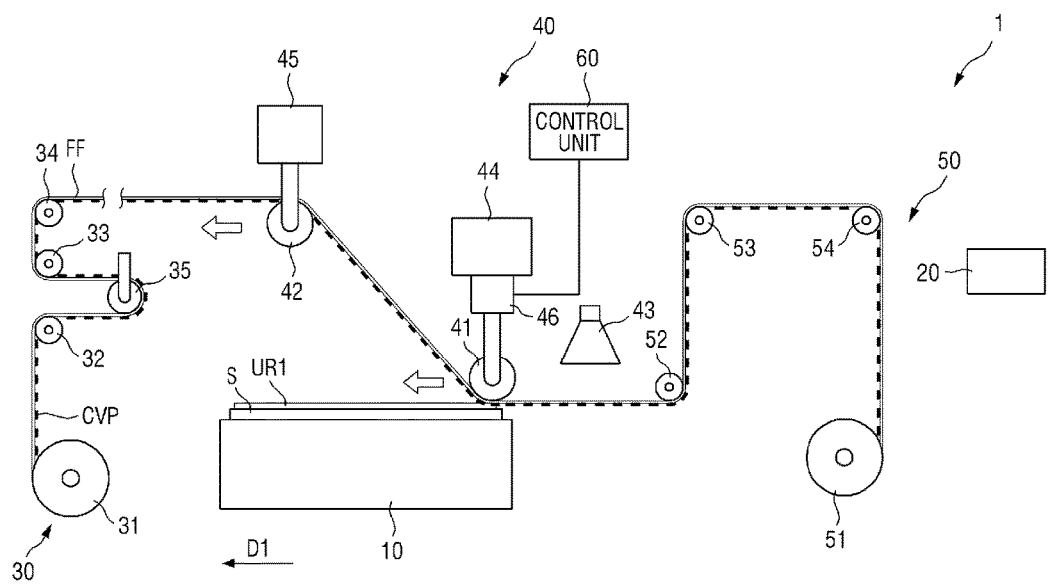

Referring to FIG. 9, the stamp film FF is pressed in a direction toward the stage 10 under force applied by a pressure roller 41, so that the stamp film FF comes into contact with the photocurable resin UR1 coated on the substrate S at a first side of the substrate S (or the stage 10). In an exemplary embodiment, for example, the pressure roller 41 may descend to bring the stamp film FF into contact with the photocurable resin UR1 a the right side thereof. The stamp film FF may be maintained under tension as described above.

The pressure roller 41 and an idle roller 42 are horizontally moved together in a first direction D1 to sequentially press portions of the stamp film FF, so that the stamp film FF comes into contact with portions the photocurable resin UR1 along the first direction up to a second side of the photocurable resin UR1 opposite to the first side thereof.

The pressure roller 41 may move horizontally with respect to the stamp film FF to move across the stamp film FF and press the portions of the stamp film FF into contact with portions the photocurable resin UR1 sequentially in the first direction D1. The pressure roller 41 may maintain contact with the stamp film FF as the pressure roller 41 moves along the first direction D1. While the pressure roller 41 moves in the first direction D1 to press the stamp film FF in contact with the photocurable resin UR1, the stamp film FF may not move in the first direction D1, without being limited thereto.

Figure 10:
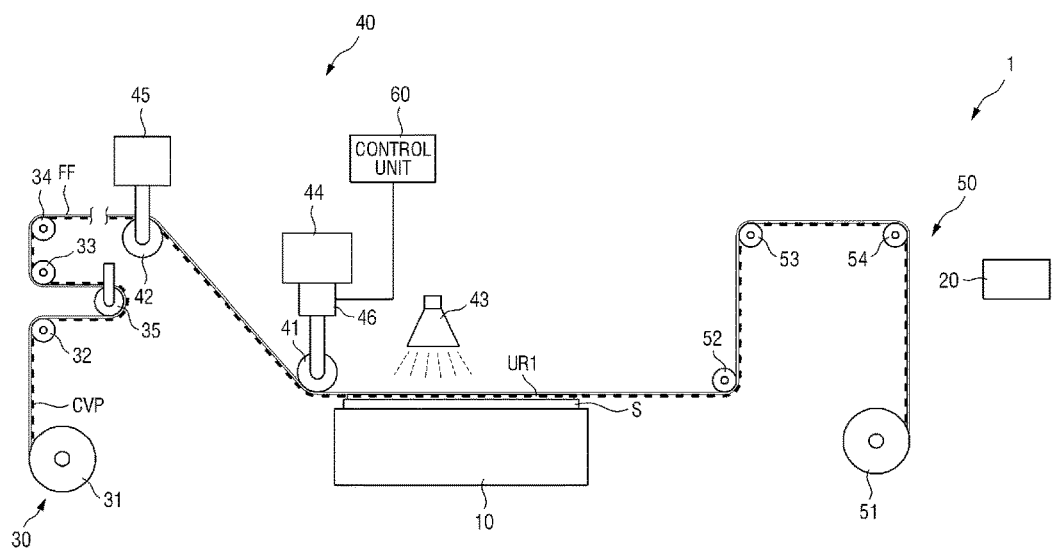

Referring to FIG. 10, a light source 43 is placed above the stamp film FF in contact with the photocurable resin UR1 and irradiates ultraviolet light to the stamp film FF in contact with the photocurable resin UR1. As a result, with the stamp film FF in contact with the photocurable resin UR1, the photocurable resin UR1 is cured.

Figure 11:
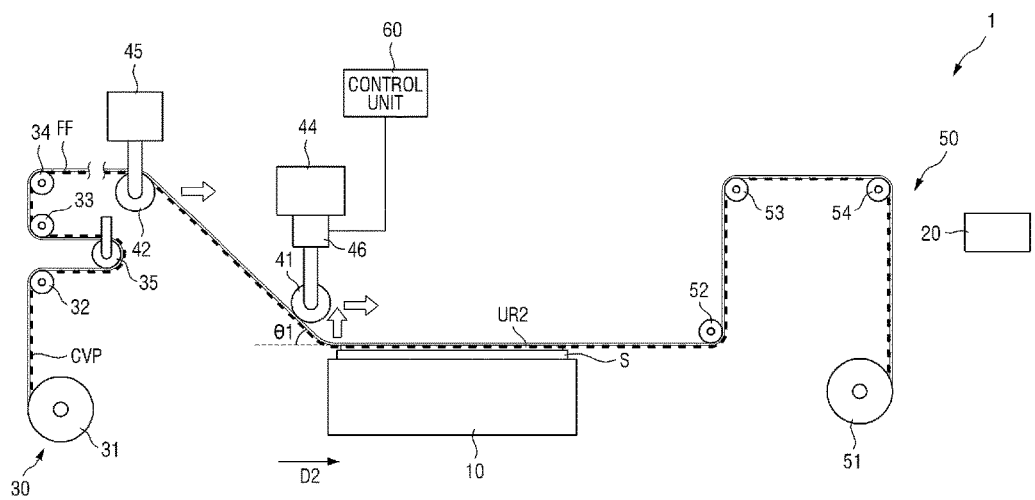
Figure 12:
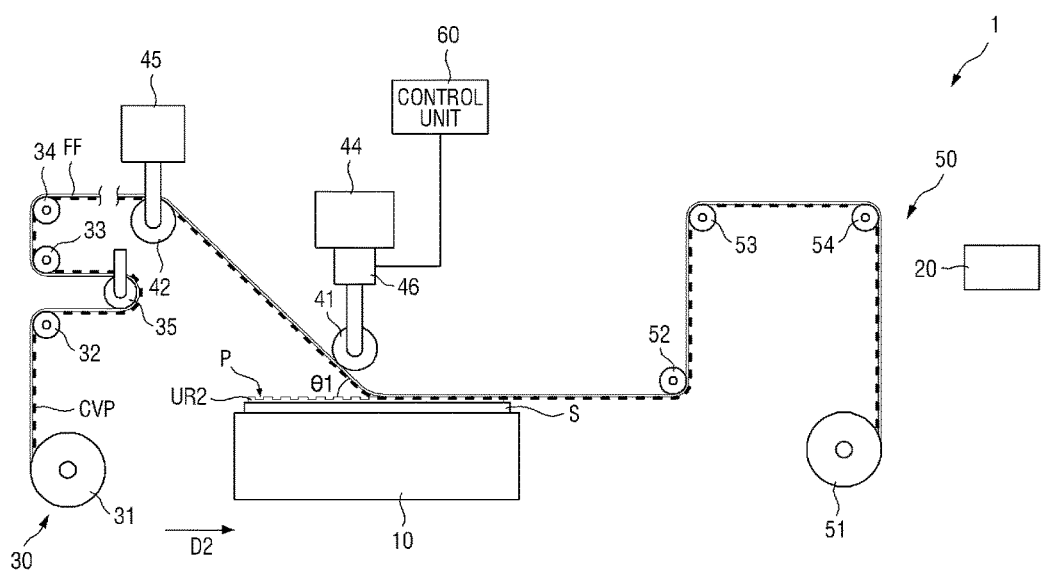

Referring to FIGS. 11 and 12, the pressure roller 41 is moved upward away from the stage 10 having the substrate S thereon by a predetermined distance and then moved horizontally in a second direction D2 opposite to the first direction D1 together with the idle roller 42. With the movement of the pressure roller 41 and idle roller 42 horizontally in the second direction D2, the stamp film FF under tension is urged away from the substrate S to peel the stamp film FF off from the photocurable resin UR2, thereby exposing the formed patterns P of the photocurable resin UR2. Here, the photocurable resin UR2 is the cured patterned photocurable resin UR1.

During peeling off of the stamp film FF from the photocurable resin UR2, the peeling force of the stamp film FF is detected in real time by a pressure sensor 46. The peeling force of the stamp film FF may be detected as a force measured by the pressure sensor 46 in a state where the tension of the stamp film FF is kept constant.

A control unit 60 may detect and determine a change in the peeling force of the stamp film FF by referring to the peeling force of the stamp film FF detected and measured in real time by the pressure sensor 46. In FIGS. 11 and 12, the stamp film FF is shown peeled off with a normal peeling force. When the peeling force of the stamp film FF is normal, a peeling angle may be θ1.

Figure 13:
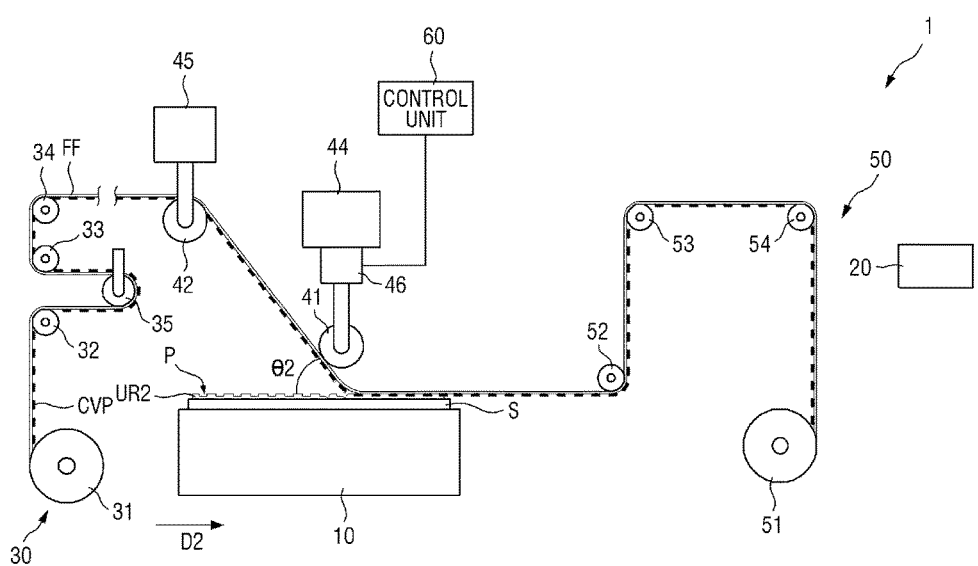

In FIG. 13, the peeling force of the stamp film FF is greater than the normal peeling force. In this case, the peeling angle may be changed from θ1 to θ2.

When the control unit 60 detects a change in the peeling force of the stamp film FF as described above, it may identify a position, where the change in the peeling force of the stamp film FF is detected, such as a position of a pattern P in the photocurable resin UR2 at which the change in peeling force has occurred.

In addition, when a change in the peeling force of the stamp film FF is greater than a preset amount of peeling force change, the control unit 60 may determine that a defect has occurred in the pattern P of the photocurable resin UR2 for which the position is detected.

In addition, when a defect occurs in the patterns P of the photocurable resin UR2, the control unit 60 may control the peeling speed of the stamp film FF such as to be lower than a predetermined peeling speed as follow-up processing, to minimize or prevent further defects.

In addition, when a period of time during which the peeling force of the stamp film FF measured by the pressure sensor 46 is outside a preset peeling force range relative to a normal peeling force is outside a preset time range, the control unit 60 may determine that the operation of the pressure roller 41 is abnormal. In this case, to minimize or effectively prevent further defects, further follow-up processing may be performed or overall processing may be ended pending determination of further action.

One or more embodiment of the invention provides at least one of the following advantages.

An imprint apparatus according to an embodiment can detect a defect in fine patterns formed on a substrate by measuring the peeling force of a stamp film relative to a fine-patterned material layer in real time.

Accordingly, the occurrence of a defect in patterns formed for an actual device using the fine-patterned material layer can be reduced.

However, the effects of the invention are not restricted to the one set forth herein. The above and other effects of the invention will become more apparent to one of daily skill in the art to which the invention pertains by referencing the claims.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. An imprint method comprising:
   applying a material layer for forming a patterned layer having a pattern, to a substrate;
   feeding a stamp film including a stamp pattern corresponding to the pattern of the patterned layer, along a pressure roller and an idle roller, to dispose the stamp pattern of the stamp film facing the material layer on the substrate;
   forming the patterned layer having the pattern, comprising:
      the pressure roller pressing the stamp film including the stamp pattern toward the material layer on the substrate to contact the stamp pattern of the stamp film with the material layer and form the pattern in the material layer,
      curing the material layer in contact with the stamp pattern of the stamp film, and
      moving the pressure roller and the idle roller to peel the stamp film including the stamp pattern off the material layer which is cured, by a peeling force, to form the patterned layer having the pattern from the material layer which is cured; and
   detecting a defect in the pattern of the formed patterned layer, during the peeling of the stamp film off the material layer which is cured, by sensing the peeling force in real time by a pressure sensor connected to the pressure roller.

2. The method of claim 1, wherein the pressure sensor is a load cell.

3. The method of claim 1, wherein
   the stamp film including the stamp pattern corresponding to the pattern of the patterned layer is fed from a stamp feeding unit comprising a tension roller which maintains tension of the stamp film including the stamp pattern constant, and
   the pressure sensor connected to the pressure roller senses the peeling force in real time in a state where the tension of the stamp film including the stamp pattern is maintained constant by the tension roller of the stamp feeding unit.

4. The method of claim 1, wherein
the pressure roller presses the stamp film including the stamp pattern toward the material layer on the substrate by applying a pressing force to the stamp film including the stamp pattern, and
the pressure sensor connected to the pressure roller senses the pressing force applied to the stamp film including the stamp pattern when the stamp film including the stamp pattern is pressed.

5. The method of claim 1, the detecting the defect in the pattern of the formed patterned layer further comprises a control processor determining whether the defect has occurred by detecting in real time, a change in the peeling force sensed in real time by the pressure sensor connected to the pressure roller.

6. The method of claim 5, the detecting the defect in the pattern of the formed patterned layer further comprises the control processor identifying a position in the material layer which is cured at which the change in the peeling force is detected as a position in the pattern of the formed patterned layer at which the defect has occurred.

7. The method of claim 5, the detecting the defect in the pattern of the formed patterned layer further comprises the control processor determining that the defect has occurred in the pattern of the formed patterned layer when the change in the peeling force is greater than a preset peeling force change.

8. The method of claim 5, wherein the moving the pressure roller and the idle roller peels the stamp film off the material layer which is cured, at a peeling speed,
further comprising when the control processor determines the defect occurs in the pattern of the patterned layer, the control processor adjusting the peeling speed to be lower than a preset peeling speed.

9. The method of claim 5, further comprising the control processor detecting a period of time at which the peeling force is outside a preset peeling force,
wherein when the control processor detects the period of time at which the peeling force is outside the preset peeling force is outside a preset time range, the control processor determines that operation of the pressure roller is abnormal.

10. The method of claim 1, wherein the moving the pressure roller and the idle roller to peel the stamp film off the material layer which is cured by the peeling force comprises moving the pressure roller away from the substrate having the material layer which is cured thereon and in a direction parallel to the substrate.

11. The method of claim 1, wherein the curing the material layer comprises exposing the material layer in contact with the stamp film including the stamp pattern to a light source or a heat source.

12. The method of claim 1, wherein the applying the material layer for forming the patterned layer having the pattern, comprises a material applicator providing a resin material to the substrate.

* * * * *